(12) United States Patent
Detor et al.

(10) Patent No.: US 8,826,529 B2
(45) Date of Patent: Sep. 9, 2014

(54) METHOD OF FORMING A MICRO-ELECTROMECHANICAL SYSTEM DEVICE

(75) Inventors: Andrew Joseph Detor, Niskayuna, NY (US); Reed Corderman, New York, NY (US); Christopher Keimel, Niskayuna, NY (US); Marco Aimi, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 365 days.

(21) Appl. No.: 12/975,090

(22) Filed: Dec. 21, 2010

(65) Prior Publication Data
US 2011/0163397 A1 Jul. 7, 2011

Related U.S. Application Data

(63) Continuation-in-part of application No. 12/627,476, filed on Nov. 30, 2009, and a continuation-in-part of application No. 12/565,127, filed on Sep. 23, 2009, now Pat. No. 8,354,899.

(51) Int. Cl.
```
H05K 3/10      (2006.01)
C25D 7/00      (2006.01)
H05K 13/04     (2006.01)
C25D 5/50      (2006.01)
H01H 1/00      (2006.01)
H01H 59/00     (2006.01)
C25D 3/56      (2006.01)
```

(52) U.S. Cl.
CPC .......... *C25D 7/00* (2013.01); *H05K 2201/0355* (2013.01); *H01L 2924/01079* (2013.01); *H05K 13/0486* (2013.01); *C25D 3/562* (2013.01); *C25D 5/50* (2013.01); *H01H 1/0036* (2013.01); *H01H 59/0009* (2013.01); *H01H 2001/0052* (2013.01); *H01H 2001/0084* (2013.01); *Y10S 977/70* (2013.01); *Y10S 977/701* (2013.01); *Y10S 977/708* (2013.01)
USPC ................ 29/846; 29/592; 29/592.1; 29/825; 29/829; 977/700; 977/701; 977/708; 257/415; 257/E29.324; 257/E21.002; 438/52

(58) Field of Classification Search
CPC .......... H01L 2924/01078; H01L 2924/01079; H01L 29/84; H01L 23/49816; H01L 21/164; H05K 2201/0355; H05K 13/0486; B82Y 10/00; B82Y 30/00
USPC ......... 29/592, 592.1, 825, 829, 846; 977/700, 977/701, 708; 257/415, E29.324, E21.002; 438/52

See application file for complete search history.

(56) References Cited

U.S. PATENT DOCUMENTS 5,696,619 A  12/1997  Knipe et al.
6,307,169 B1 10/2001  Sun et al.
(Continued)

FOREIGN PATENT DOCUMENTS

EP  1683172 A1  7/2006

OTHER PUBLICATIONS

M. Haj-Taieb et al., "Thermal stability of electrideposited LIGA Ni-W alloys for high temperature MEMS applications", (2008) V 14, pp. 1531-1536.*

(Continued)

*Primary Examiner* — Peter DungBa Vo
*Assistant Examiner* — Azm Parvez
(74) *Attorney, Agent, or Firm* — Robert M. McCarthy

(57) ABSTRACT

A device includes a substrate (308) and a metallic layer (336) formed over the substrate (308) with a deposition process for which the metallic layer (336) is characterizable as having a pre-determinable as-deposited defect density. As a result of a fabrication process, the defect density of the metallic layer (336) is reduced relative to the pre-determinable as-deposited defect density of the same layer (336) or another layer having like composition and which is formed under like deposition conditions. In a related method, a substrate (308) is provided and a removable layer (330) is formed over the substrate (308). A metallic layer (336) is formed over the removable layer (330) and is patterned and etched to define a structure over the removable layer (330). The removable layer (330) is removed, and the metallic layer (336) is heated for a time beyond that necessary for bonding of a hermetic sealing cap (340) thereover.

17 Claims, 11 Drawing Sheets

(56) References Cited

U.S. PATENT DOCUMENTS

| | | | |
|---|---|---|---|
| 6,373,007 | B1 | 4/2002 | Calcatera et al. |
| 6,570,750 | B1 | 5/2003 | Calcatera et al. |
| 6,699,379 | B1 | 3/2004 | Ke et al. |
| 6,788,175 | B1 | 9/2004 | Prophet |
| 6,803,755 | B2 | 10/2004 | Herbert et al. |
| 6,809,412 | B1 * | 10/2004 | Tourino et al. ............. 257/678 |
| 6,876,047 | B2 | 4/2005 | Cunningham et al. |
| 6,876,283 | B1 | 4/2005 | Weber et al. |
| 6,876,482 | B2 | 4/2005 | Dereus |
| 7,126,220 | B2 | 10/2006 | Lahiri et al. |
| 7,233,048 | B2 * | 6/2007 | Rybnicek ............. 257/414 |
| 7,247,035 | B2 | 7/2007 | Mok et al. |
| 7,372,348 | B2 | 5/2008 | Xu et al. |
| 7,393,594 | B2 | 7/2008 | Yamasaki et al. |
| 7,812,703 | B2 | 10/2010 | Carlson et al. |
| 8,052,810 | B2 * | 11/2011 | Okada et al. ............. 148/518 |
| 2004/0154925 | A1 | 8/2004 | Podlaha et al. |
| 2005/0029109 | A1 | 2/2005 | Zhang et al. |
| 2007/0215448 | A1 | 9/2007 | Paranjpye et al. |
| 2009/0127082 | A1 | 5/2009 | Zhang et al. |
| 2010/0237738 | A1 | 9/2010 | Smith et al. |

OTHER PUBLICATIONS

Liu, "High Performance RF MEMS Series Contact Switch-Design and Simulations", Freescale Semiconductor, Electronic Components and Technology Conference, Tempe, Arizona, pp. 158-164, May 29-Jun. 1, 2007.

Kohn et al., "Diamond High Speed and High Power MEMS Switches", Institute of Electron Devices and Circuits, University of Ulm, Germany, 4th EMRS DTC Technical Conference, Edinburgh, 6 pages, 2007.

Haj-Taleb et al., "Thermal Stability of Electrodeposited LIGA Ni-W Alloys for High Temperature MEMS Applicaitions", Midcrosyst Technol, vol. 14, pp. 1531-1536, 2008.

Haseeb et al., "Friction and Wear Characteristics of Electrodeposited Nanocrystalline Nickel—Tungsten Alloy Films," ScienceDirect, Wear, vol. 264, pp. 106-112, 2008.

Slavcheva et al., "Electrodeposition and Properties of NiW Films for MEMS Application", Science Direct, Electrochimica Acta, vol. 50, 5573-5580, 2005.

Namburi, Electrodeposition of NiW Alloys Into Deep Recesses, A Theseis Submitted to the Graduate Faculty of the Louisiana State University and Agricultural and Mechanical College in partial fulfillment of the requirements for the degree of Master of Science in Chemical Engineering in The Department of Chemical Engineering. 50 pages, Dec. 2001.

Baril et al., "Elevated Temperature Mg—Al—Sr: Creep Resistance, Mechanical Properties, and Microstructure" JOM, pp. 34-39, Nov. 2003.

Modlinski et al., "Creep-resistant aluminum alloys for use in MEMS", Institute of Physics Publishing, Journal of Micromechanics and Microengineering, vol. 15, pp. S165-S170, Jun. 2005.

Brown et al., "Temperature dependence of asperity contact and contact resistance in gold RF MEMS switches", IOP Publishing, Journal of Micromechanics and Microengineering, vol. 19, pp. 1-9, Jan. 2009.

Eliaz et al., "Synthesis and Characterization Of Nickel Tungsten Alloys by Electrodeposition", Electrochimica Acta, vol. No. 50, Issue No. 14, pp. 2893-2904, May 5, 2005.

European Search Report and Opinion issued in connection with corresponding EP Application No. 11193469.1 on Jul. 21, 2014.

* cited by examiner

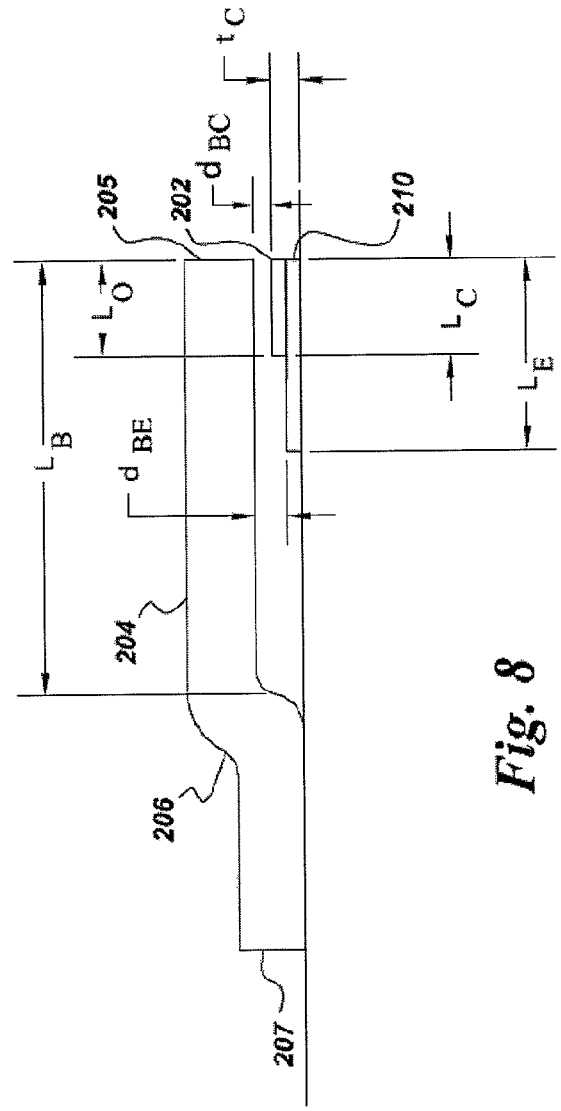
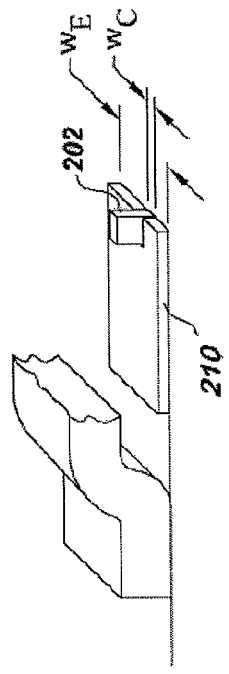
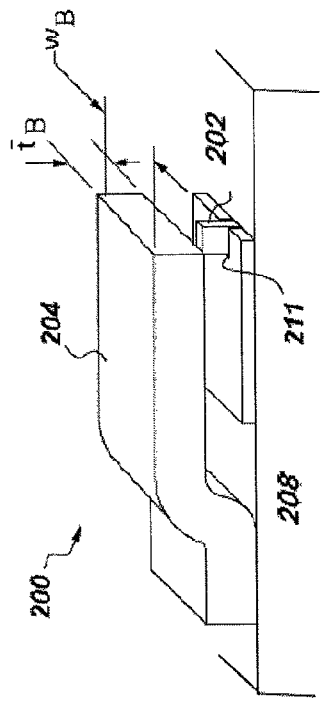
Fig. 7
Fig. 8
Fig. 9

US 8,826,529 B2

METHOD OF FORMING A MICRO-ELECTROMECHANICAL SYSTEM DEVICE

RELATED APPLICATIONS

This application is a continuation in part of U.S. patent application Ser. No. 12/627,476 "Switch Structures" filed 30 Nov. 2009 and is a continuation in part of U.S. patent application Ser. No. 12/565,127 "Switch Structure and Method" filed 23 Sep. 2009 now U.S. Pat. No. 8,354,899.

BACKGROUND

The subject matter presented herein relates to mechanical devices and, more specifically, to devices based on micro-electromechanical (MEMs) and nano-electromechanical (NEMs) technology.

Mechanical devices for numerous applications including provision of circuit breakers and high voltage, high current switching have been large in size and often require large forces to activate the switching mechanism. Such conventional switches also operate at relatively slow speeds. They are often complex and expensive to fabricate. In addition, when contacts of the switching mechanism are physically separated, arcing is known to occur and special circuitry is sometimes deployed to prevent arc current to continue to flow through the switch. Energy associated with the arc may degrade the switch contacts or present a hazardous situation.

Solid-state switches have been employed in high speed applications to switch between conducting state and non-conducting states through controlled application of a voltage. Since solid-state switches do not provide a physical gap between contacts when they are in a non-conducting state, leakage current is normally present. Solid-state switches also impart a voltage drop when in a conducting state due to internal resistances of the devices. Voltage drops and leakage currents result in power dissipation and heat generation under normal operating conditions. These have adverse effects on switch performance and the life of the switch. The inherent leakage current associated with solid-state switches renders them less desirable for use in circuit breaker applications.

Micro-electromechanical system (MEMS) based switching devices are regarded as potential alternatives to macro-electromechanical switches and solid-state switches for certain applications. This is because MEMS-based switches tend to have a low resistance when set to conduct current, and can exhibit no leakage when set to a non-conducting state. Further, MEMS-based switches are expected to exhibit faster response times than conventional electromechanical switches.

BRIEF DESCRIPTION

In one series of embodiments of a method, a substrate is provided and a removable layer is formed over the substrate. A metallic layer, comprising at least fifty atomic percent metal, is formed over the removable layer. The metallic layer is patterned and etched to define a structure over the removable layer. The removable layer is removed, and the metallic layer is heated for a time beyond that necessary for bonding of a hermetic sealing cap thereover.

In another series of embodiments, a device includes a substrate and a metallic layer formed over the substrate with a deposition process for which the conductive layer is characterizable as having a pre-determinable as-deposited defect density. As a result of a fabrication process, the defect density of the conductive layer is reduced relative to the pre-determinable as-deposited defect density of the same layer or another layer having like composition and which is formed under like deposition conditions.

DETAILED DESCRIPTION OF THE DRAWINGS

These and other features, aspects, and advantages will become better understood when the following detailed description is read with reference to the accompanying drawings, wherein.

Figure 1:
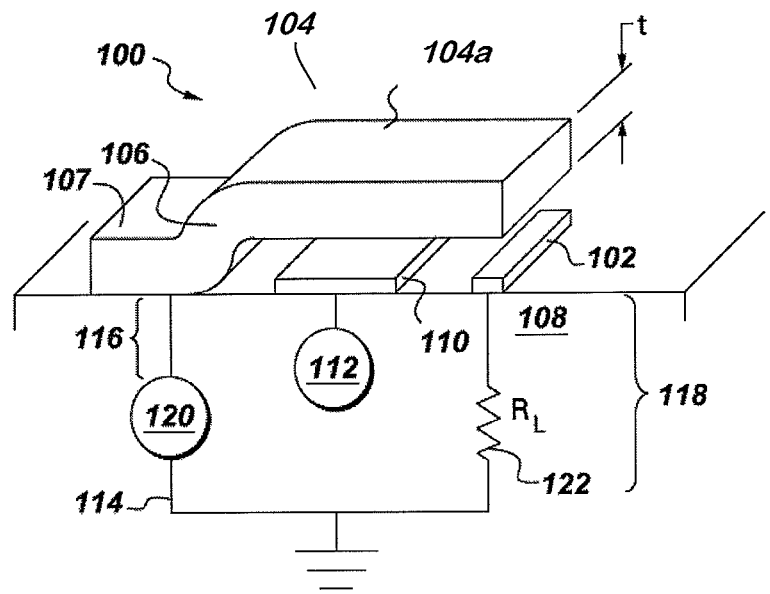
FIG. 1 is a schematic perspective view of a switch structure configured in accordance with an example embodiment.
Figure 6A:
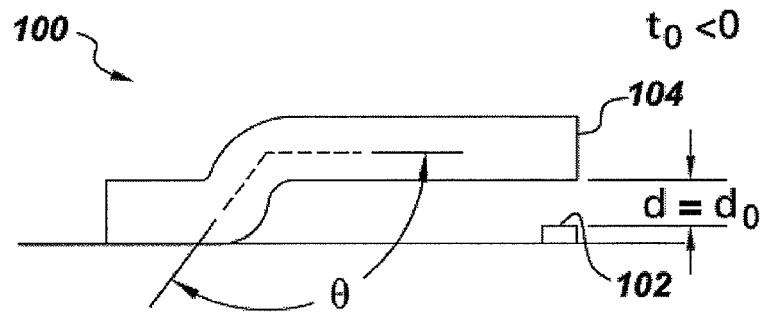
Figure 6B:
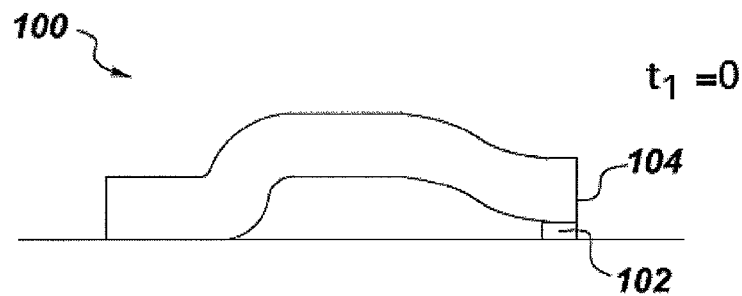
Figure 6C:
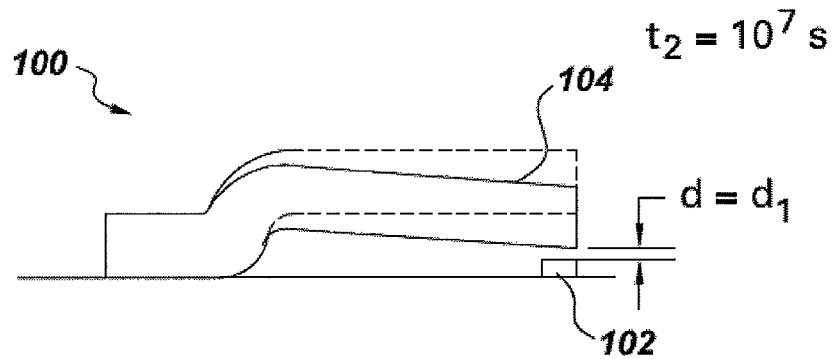
Figure 11:
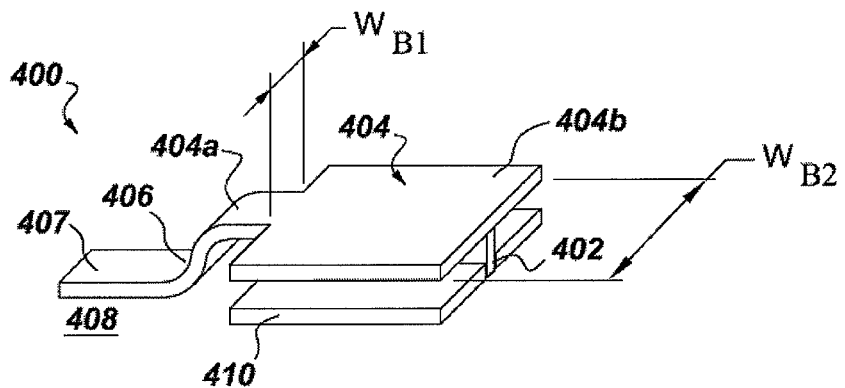
Figure 12:
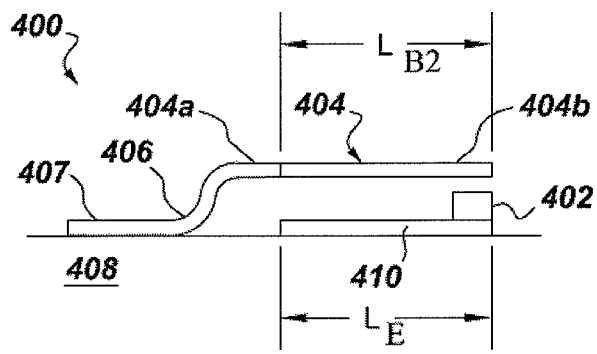
Figure 13:
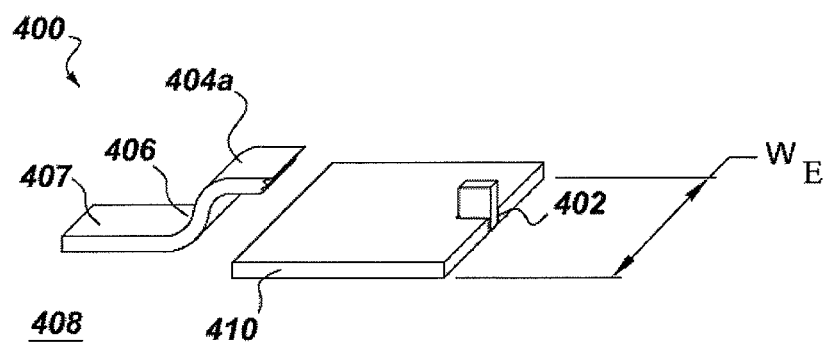
Figure 14:
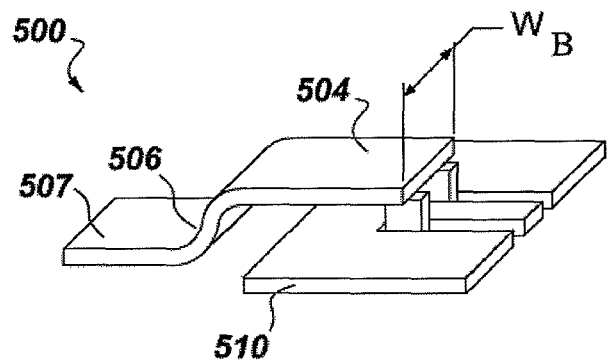
Figure 15:
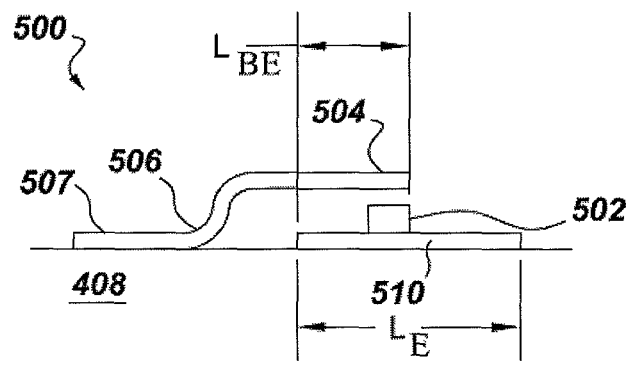
Figure 16:
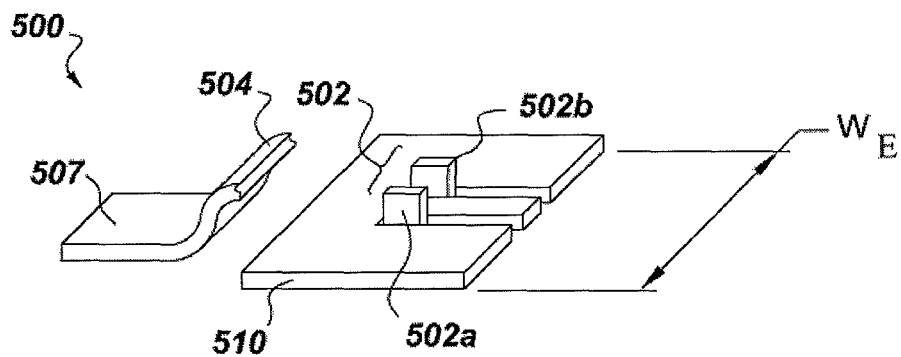
Figure 17:
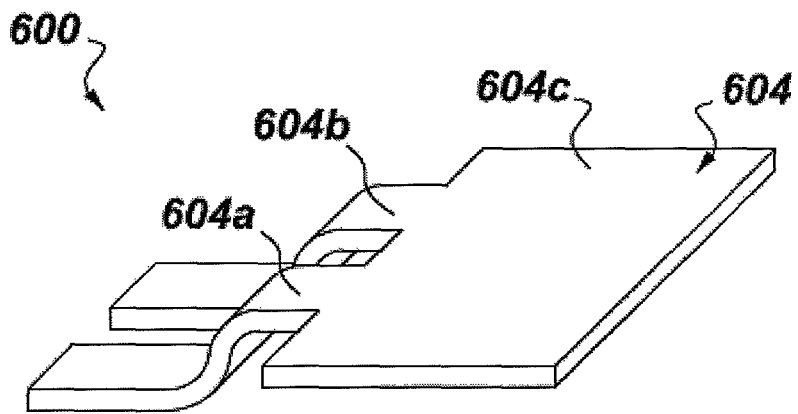
Figure 18:
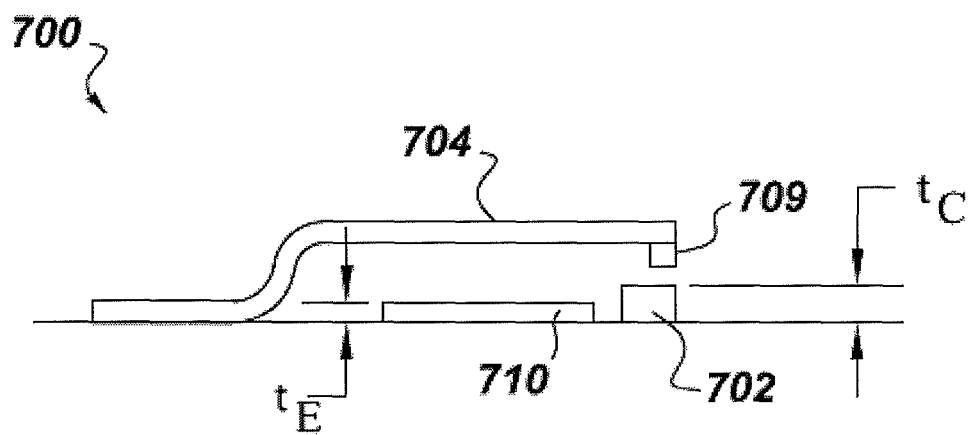
Figure 19A:
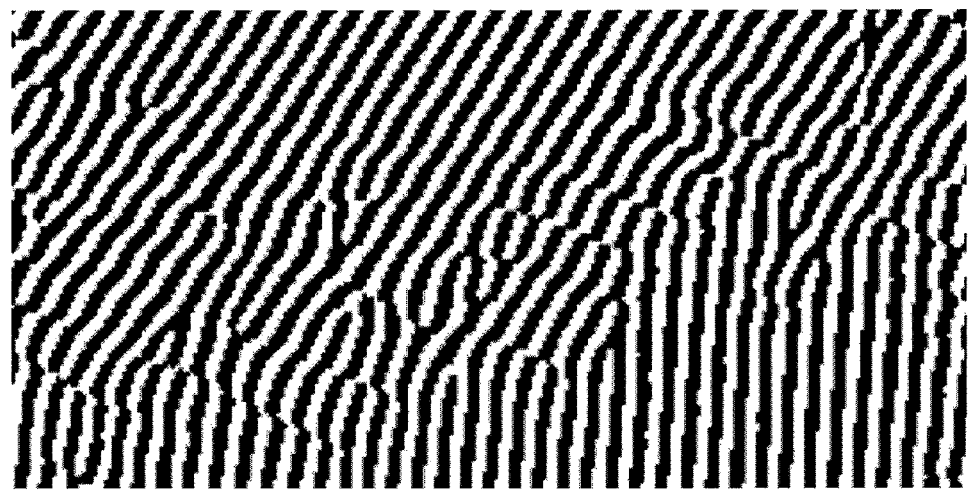
Figure 19B:
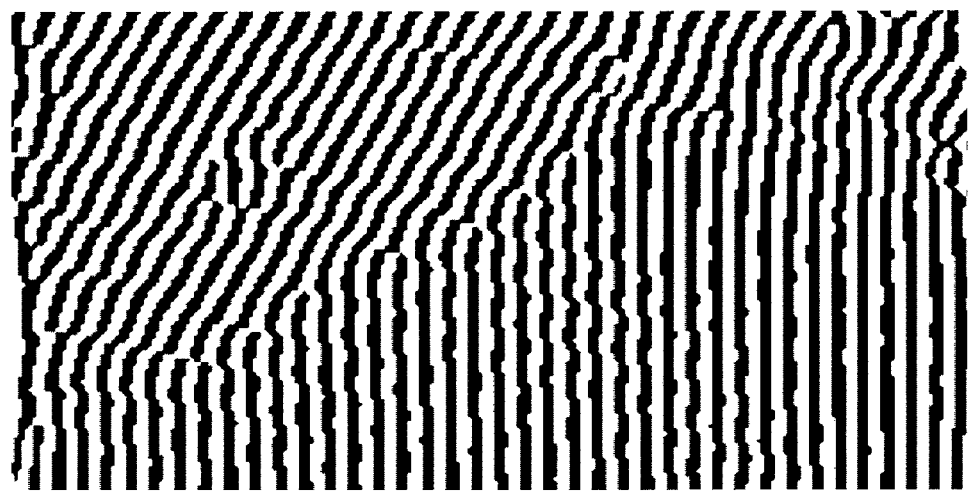
Figure 20A:
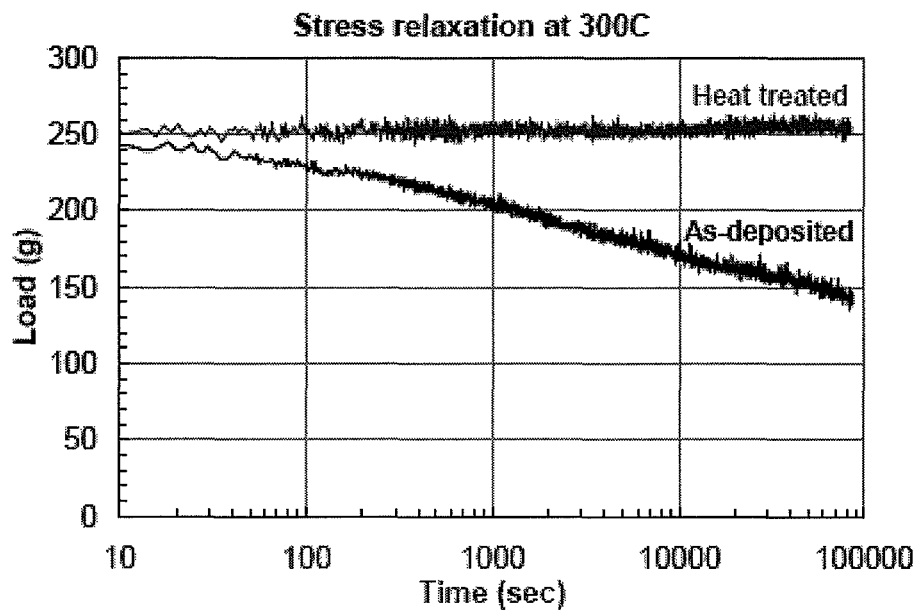
Figure 20B:
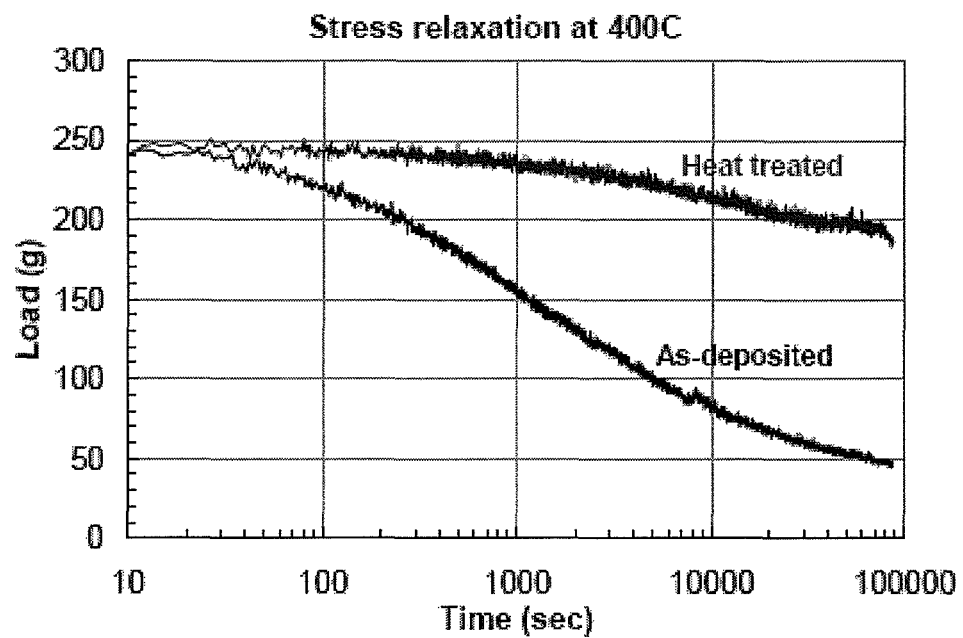

FIGS. 6A-C are side views of the switch structure of FIG. 1 demonstrating the movement of the beam between the contacting and non-contacting positions;

FIG. 7 is a schematic side view of a switch structure configured in accordance with another example embodiment;

FIG. 8 is a schematic side view of the switch structure of FIG. 7;

FIG. 9 is a schematic fragmentary perspective view of the switch structure of FIG. 7;

FIGS. 10A-10F are schematic side views representing a process for fabricating a switch structure configured in accordance with an example embodiment;

FIG. 11 is a schematic perspective view of a switch structure configured in accordance with another example embodiment;

FIG. 12 is a schematic side view of the switch structure of FIG. 11;

FIG. 13 is a schematic fragmentary perspective view of the switch structure of FIG. 11;

FIG. 14 is a schematic perspective view of a switch structure configured in accordance with yet another example embodiment;

FIG. 15 is a schematic side view of the switch structure of FIG. 14;

FIG. 16 is a schematic fragmentary perspective view of the switch structure of FIG. 14;

FIG. 17 is a schematic perspective view of a switch structure configured in accordance with still another example embodiment;

FIG. 18 is a schematic side view of a switch structure configured in accordance with yet another example embodiment;

FIG. 19A is a filtered TEM image of a grain boundary showing atomic planes of differing orientation meeting to form a grain boundary;

FIG. 19B is a filtered TEM image of a grain boundary similar to that shown in FIG. 19A after a relatively low temperature heat treatment; and FIGS. 20A and 20B illustrate results of stress relaxation tests showing improved deformation resistance in samples after heat treatment.

Like reference numerals denote like features throughout the drawings.

DETAILED DESCRIPTION

Figure 2:
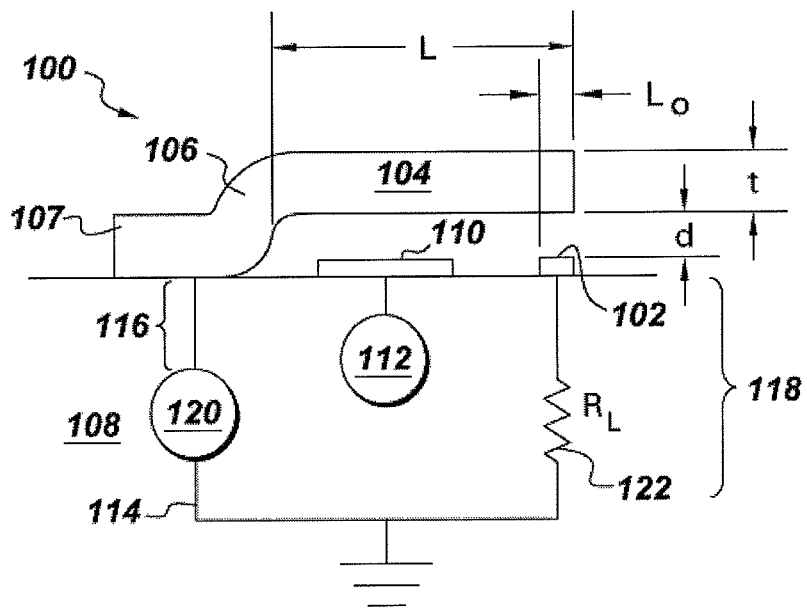
FIG. 2 is a schematic side view of the switch structure of FIG. 1.
Figure 3:
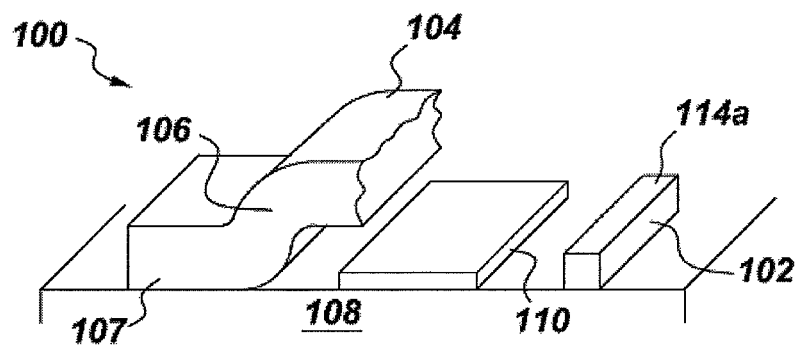
FIG. 3 is a schematic fragmentary perspective view of the switch structure of FIG. 1.

Example embodiments are now described with reference to the accompanying drawings. Some of these embodiments may address the above and other needs. Referring to FIGS. 1-3, several views are shown of a switch structure 100 configured in accordance with an example embodiment. The example switch structure 100 includes a contact 102, which at least partially comprises a conductive material (e.g., a metal). The switch structure 100 also includes a conductive element, illustrated as a cantilevered beam 104, comprising conductive material (e.g., a metal). A cantilevered portion 104a of the beam extends over the contact 102. In some embodiments, the conductive element may also include other features, such as, for example, a protective (and possibly non-conductive) coating on the beam 104 or a contact pad disposed along the portion of the beam intended to make contact with the contact 102. The beam 104 can be supported by an anchor 106 and a base 107, from which the cantilevered portion 104a extends, and which may be integrated with the beam. The anchor and the base serve to connect the cantilevered portion 104a of the beam to an underlying support structure, such as the illustrated substrate 108. In the embodiment of the switch structure 100 shown in FIGS. 1-3, both the contact 102 and the anchor 106 are formed on the substrate 108 with conventional microfabrication techniques (e.g., electroplating, vapor deposition, photolithography, wet and/or dry etching, etc.).

The switch structure 100 may constitute a portion of a microelectromechanical or nanoelectromechanical device or a microelectromechanical system (MEMS). For example, the contact 102 and beam 104 may have dimensions on the order of ones or tens of nanometers or micrometers. In one embodiment, the beam 104 may have a surface area-to-volume ratio that is greater than or equal to $10^8$ $m^{-1}$, while in another embodiment the ratio may be closer to $10^3$ $m^{-1}$.

Integrated circuitry may be formed on the substrate 108, e.g., including metal-oxide-semiconductor field effect transistors (MOSFETs) and patterned conductive layers (not shown) that serve to provide electrical connections among the various components. Such patterned conductive layers may also provide electrical connections to the contact 102 and beam 104 (the connection to the latter being, for example, through the anchor 106), which connections are shown schematically in FIGS. 1 and 2 and described below. The semiconductor devices and conductive layers, like the features of the switch structure 100, can also be fabricated using conventional micro-fabrication techniques. In one embodiment, the substrate 108 may be a portion of a monocrystalline semiconductor wafer that has been processed so as to include one or more MOSFETs, with the switch structure 100 and other circuitry formed on a surface of the wafer. The switch structure 100 may be disposed over one of the MOSFETs (e.g., along a line normal to the surface of the wafer) and may be operable along with the MOSFET.

Figure 4:
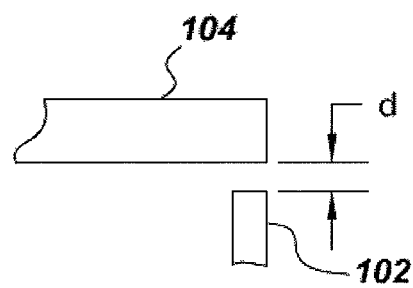
FIG. 4 is a schematic side view of the switch structure of FIG. 1 in an open position.
Figure 5:
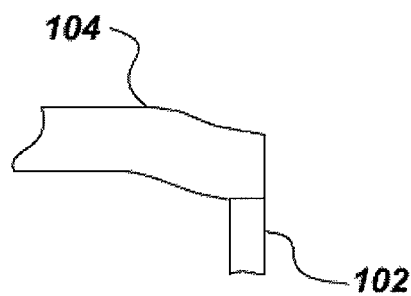
FIG. 5 is a schematic side view of the switch structure of FIG. 1 in a closed position.

Referring also to FIGS. 4 and 5, the beam 104 can be configured to be selectively moveable between a first, non-contacting or "open" position, shown in FIG. 4, in which the beam is separated from the contact 102 by a separation distance d, and a second, contacting or "closed" position, shown in FIG. 5, in which the beam comes into electrical contact with the contact 102. For example, the beam 104 can be configured to undergo deformation when moving between the contacting and non-contacting positions, such that the beam is naturally disposed (i.e., in the absence of externally applied forces) in the non-contacting position and may be deformed so as to occupy the contacting position while storing mechanical energy therein. In other embodiments, the undeformed configuration of the beam 104 may be the contacting position.

The switch structure 100 may also include an electrode 110 which, when appropriately charged, provides a potential difference between the electrode and the beam 104, resulting in an electrostatic force that pulls the beam toward the electrode and against the contact 102. With application of sufficient voltage to the electrode 110, the electrostatic force deforms the beam 104 and thereby displaces the beam from the non-contacting (i.e., open or non-conducting) position shown in FIG. 4 to the contacting (i.e., closed or conducting) position shown in FIG. 5. Therefore, the electrode 110 may act as a "gate" with respect to the switch structure 100, with voltages (referred to as "gate voltages") applied to the electrode 110 serving to control the opening or closing of the switch structure. The electrode 110 may be in communication with a gate voltage source 112, so that a gate voltage $V_G$ may be selectively applied to the electrode 110.

The contact 102 and the beam 104 are components of the circuit 114. The exemplary circuit 114 has a first side 116 and a second side 118 that, when disconnected from one another, are at different electric potentials relative to one another (as where only one of the sides is connected to a power source 120). The contact 102 and beam 104 can be respectively connected to either of the sides 116, 118 of the circuit 114, such that deformation of the beam between the first and second positions acts to respectively pass and interrupt a current therethrough. The beam 104 may be repeatedly moved into and out of contact with the contact 102 at a frequency (either uniform or non-uniform) that is determined by the application for which the switch structure 100 is utilized. When the contact 102 and the beam 104 are separated from one another, the voltage difference between the contact and beam is referred to as the "stand-off voltage."

In one embodiment, the beam 104 may be in communication (e.g., via the anchor 106) with the power source 120, and the contact 102 may be in communication with an electrical load 122 having a load resistance $R_L$. The power source 120 may be operated as a voltage source or a current source. The beam 104 acts as an electrical contact, allowing a load current (e.g., with an amplitude greater than or equal to about 1 mA and an oscillation frequency of about 1 kHz or less) to flow from the power source 120 through the beam 104, into the contact 102 and to the electrical load 122 when the beam is in the contacting position, and otherwise disrupting the electrical path and preventing the flow of current from the power source to the load when the beam is in the non-contacting position. The above-indicated current and switching frequency might be utilized in relatively higher power distribution applications. In other embodiments, such as in applications where the switch structure 100 will be utilized in a signaling context (often operating at relatively lower powers), the power source 120 may provide a current having a magnitude of 100 mA or less (and down to the 1 µA range) with a frequency of oscillation greater than 1 kHz.

The above-described switch structure 100 could be utilized as part of a circuit including other switch structures, whether similar or dissimilar in design, in order to increase the current and voltage capacity of the overall circuit. Such switch structures could be configured in series or in parallel to facilitate an even distribution of stand-off voltage when the switch structures are open and an even distribution of current when the switch structures are closed.

During operation of the switch structure 100, the beam 104 may be subjected to externally applied forces, such as the electrostatic force established by the electrode 110 discussed above, that cause the beam to deform between the first and second positions (i.e., into and out of contact with the contact 102). The switch structure 100 may operate at room temperature and up to or above 40 C, but often less than 50 percent or less than 30 percent of the melting temperature of the material(s) from which the beam is substantially formed. Further, for applications in which the switch structure 100 is expected to possess a useful lifetime on the order of years (e.g., relatively higher power distribution applications), the beam 104 may remain in contact with the contact 102 for a cumulative time of at least $10^4$ seconds, and in some cases for more than $10^6$ seconds or even $10^9$ seconds. Still further, when deformed so as to make electrical connection or physical contact with the contact 102, the beam 104 may experience relatively high stresses. The magnitude of the stresses depend, in part, on the geometry of the switch structure 100 and the material composition of the beam.

As one example of the above, the cantilevered beam 104 of the switch structure 100 can be a layer comprising nickel (Ni)-12 atomic percent tungsten (W), or nickel (Ni)-20 atomic percent tungsten (W), with a length L of about 100 µm, an aspect ratio (length L to thickness t) of about 25 to 1, and a separation distance d from the contact 102 of about 1-3 µm, where the contact is located opposite the free end of the beam and overlaps the beam by a distance $L_o$. For such a geometry, a stress of more than 100 MPa, e.g., 600 MPa or more, may be present in substantial portions of the beam 104 or the anchor 106 when the beam is deformed so as to contact the contact 102. The beam 104 or the anchor 106 may be required to sustain this stress for longer than $10^4$ seconds, or longer than $10^9$ seconds, under normal use conditions, without failure. These stresses may be distinguished from more localized, and often transient, stresses that may be present around stress concentration regions, such as around geometrical irregularities, surface asperities, and defects.

For proper operation of a switch structure (such as the switch structure 100) including a cantilevered beam (or other deformable contacting structure) and associated contact, it is often intended that the beam selectively assume either the contacting position or the non-contacting position as specified by the presence or absence of an external force urging the beam into physical contact with the contact (e.g., the electrostatic force resulting from application of the gate voltage associated with the electrode 110). However, a variety of investigators have observed that switch structures including a metallic, micrometer-scale cantilevered beam (or other deformable contacting structure) tend to malfunction, such that the behavior of the switch structure is not as intended. These malfunctions have been generally attributed to surface adhesion-related issues. Specifically, in light of the large surface area-to-volume ratio present in a micrometer-scale beam (or other deformable contacting structure), the energy reduction associated with the elimination of free surface where the beam contacts the associated contact pad may be an influential factor and may even be large relative to the mechanical energy stored in the beam during deformation. Accordingly, the cantilevered beam and associated contact may remain adhered to one another, following removal of the external force otherwise urging the two into contact, because the internal strain energy of the beam is insufficient to induce separation of the beam from the contact.

In contrast to prevailing theories, Applicants have had observations which suggest that failure of switch structures including metallic, small-scale cantilevered beams is often due not primarily to adhesion of the beam and an associated contact but, rather, may be largely attributable to a change in the undeformed configuration of the beam. That is, as an external force is applied to urge the beam into contact with the associated contact, the beam undergoes permanent time-dependent plastic deformation, also referred to as "creep" or stress relaxation.

As the beam undergoes plastic deformation, the shape of the beam, in the absence of the external force, which moves the beam into a contacting configuration, becomes more similar to the shape of the beam when the beam is in the contacting position. Similarly, the mechanical strain energy initially associated with the beam when the beam is in the contacting position is reduced, in some cases to nearly zero. Ultimately, the switch structure may fail due to adhesion between the beam and the associated contact, but this failure mechanism may be secondary, and may be due to the reduction in the mechanical strain energy associated with the beam in the contacting position. In other words, upon attempting to open the switch (release the beam), the beam remains in the same closed position due to permanent deformation of the material over a period of time, rendering the switch inoperable. The extent of time-dependent plastic deformation in the switch structure beams is surprising, in that these devices typically operate at ambient temperatures which are less than 50 percent, e.g., less than 30 percent, of the melting temperature of the metallic material from which the beam is formed. Temperatures above at least thirty to fifty percent of the melting temperature are typically required to cause measurable creep in bulk materials.

The term metallic material as used herein refers to one or more layers of material where one of the layers contains at least fifty atomic percent metal, which may be alloy.

The term creep resistance as used herein refers to the ability of a material to resist time-dependent plastic deformation when subjected to continual loads or stresses. Similarly, the term creep resistance also describes resistance to time dependent stress relaxation when a material is subject to constant strain (e.g., as in stress relaxation testing). Creep may manifest itself in a variety of ways, including a change in shape under constant loading or a change in stress under constant deformation. In view of the above-described discovery, according to embodiments presented herein, the beam 104 may be formed substantially of metallic material, e.g., more than fifty atomic percent, having improved creep resistance. That is, the material may be configured or processed to inhibit time-dependent deformation, such as at temperatures ranging from room temperature up to or above 40° C. or, more generally, less than 50 percent of the melting temperature of the material from which the beam is substantially formed. If the beam is formed of multiple discrete metallic materials, the range may less than 50 percent of the lowest melting temperature of one of the metals constituting a substantial part of the beam.

A material configured to inhibit time-dependent deformation, referred to herein as a "creep-resistant" material, exhibits a relatively small steady-state plastic strain rate when subjected to continual loads or stresses. That which constitutes a "small" plastic strain rate may depend on the context within which creep may be occurring. For present purposes, a creep-resistant material is generally a material for which the steady-state plastic strain rate is less than or equal to about $10^{-12}$ $s^{-1}$ for stresses up to about 25 percent of the yield strength of the material at temperatures less than half the melting temperature of the creeping material, e.g., less than half the melting temperature of the material from which the beam is substantially formed. If the creeping material is formed of multiple discrete metallic materials, the range may be less than 50 percent of the lowest melting temperature of one of the metals constituting a substantial part of the creeping material. Further, the beam 104 can be considered to be "formed substantially" of metallic material that is configured to inhibit time-dependent deformation when the mechanical behavior of the beam is generally or significantly determined by the mechanical behavior of constituent creep resistant metallic material.

A variety of chemical compounds can act as creep-resistant metallic materials when being utilized at maximum temperatures which are in the range of temperatures which are less than about half the melting temperature of the material, e.g., less than one third the melting temperature of the material. These materials can be synthesized in a variety of ways so as to produce a variety of operable microstructures. For example, creep-resistance can result from an increase in melting temperature which, for a given operational condition, will slow diffusion-based recovery processes. Creep-resistance can also be a consequence of microstructural manipulation. For example, crystalline material can be formed with small grain size, thereby limiting creep related to dislocation motion at moderate temperatures (e.g., less than seventy percent of the melting point temperature of the metallic material). Additives may be dissolved in the crystal lattice, thereby leading to solid solution strengthening, or may form another phase (e.g., by precipitating out at grain boundaries or within the crystal lattice). The additives can act as discrete particles that serve to block dislocation motion, inhibit diffusion, or act as traps for voids in the crystal lattice. In some embodiments, oxides or carbides may be utilized as the additives. Generally, examples of creep-resistant materials include superalloys, including Ni-based and/or cobalt (Co)-based superalloys, Ni—W alloys, Ni—Mn alloys, gold containing small amounts of Ni and/or Co ("hard gold"), W, intermetallics, materials subject to solid solution and/or second phase strengthening, and materials having a crystal structure which inhibits plastic deformation, such as hexagonal structures or materials with low stacking fault energies.

By forming the beam 104 substantially from creep-resistant material having a relatively high melting temperature, it has been observed by Applicants that significant creep during use may be avoided, such that the separation distance d between the beam and the contact 102 can be maintained fairly constant, e.g., within 20-40 percent of its initial value for an in-use time of up to 1 year and in some cases beyond 20 years. In other words, for each instance in which the beam 104 is urged from the non-contacting position (in which the beam is separated from the contact 102 by a distance d) and toward the contacting position by an applied force and then the applied force is removed, the beam will substantially return to the non-contacting position such that the beam is separated from the contact by the distance d, where the value of d varies by less than 40 percent, and in some cases less than 20 percent.

An exemplary creep-resistant material is an alloy comprising Ni and W. Applicants have found that alloys containing at least 65 atomic percent Ni and at least 1 atomic percent W tend to exhibit enhanced creep resistance. One specific example of an alloy that has been observed by Applicants to exhibit such a resistance to creep is Ni-20 atomic percent W, i.e., a material comprising Ni and W wherein the W component is 20 atomic percent of the material. However, as indicated above, alloys substantially comprising Ni and as little as about 1 atomic percent W, ranging up to or above thirty percent atomic percent W, are expected to show improved creep resistance, and the extent to which creep is inhibited will scale with W content.

Alloys of Ni and W according to several embodiments (e.g., when electroplated under direct current conditions) have an average grain size less than or equal to about 1 µm, and in some cases down to a size on the order of 10 nm. For example, an alloy of 80 atomic percent Ni and 20 atomic percent W may be formed by electrodeposition to produce a film of Ni—W material having an average grain size of about 10-100 nm. The Ni—W film may be subsequently exposed to elevated temperature, for example, by annealing at 300-450° C. for 30 minutes or longer to further enhance the material's resistance to creep. Generally, Applicants have found that annealing Ni—W films at relatively low temperatures, but which temperatures are higher than those that will be experienced during use conditions (which, for higher power distribution applications, tends to be less than or equal to about 250° C.), acts to limit the extent of time-dependent deformation experienced by structures formed of the annealed Ni—W film.

As indicated above, the process temperatures associated with the production of the above described switch structure 100 formed substantially of metallic material configured to inhibit time-dependent deformation are moderate, and may be less than 450° C. although higher anneal temperatures, e.g., ranging up to 700° C. or higher are suitable. The ability to perform an effective anneal to instill enhanced creep resistance properties at relatively low temperatures, e.g., between 250° C. and 500° C., is in contrast to the substantially higher temperatures required to form a conductor from silicon, e.g., typically greater than 900° C. when employing a conventional doping procedure. The lower processing temperatures associated with anneal of the switch structure 100 facilitates integration of the switch structure with temperature-sensitive components, such as, for example, MOSFETs.

The creep-resistant material of the beam 104 may include other binary alloys, including any combination of Al, Ti, Cr, Mn, Fe, Co, Ni, Cu, Zn, Nb, Mo, Ag, Ta and W. The creep-resistant material of the beam 104 may also include amorphous metals. Examples of suitable amorphous metals include alloys of at least Ni, W, and iron (Fe), where the alloy includes about 80 atomic percent or more Ni, between about 1 and 20 atomic percent W, and about one atomic percent or less Fe. These materials are characterized by their lack of long-range atomic order, and are generally considered to be relatively resistant to plastic deformation. Many amorphous alloys are formed by mixing many different elements, often with a variety of atomic sizes, such that the constituent atoms cannot coordinate themselves into an equilibrium crystalline state during cooling from a liquid state. Other examples of amorphous metals include, but are not limited to, alloys comprising 55 atomic percent palladium (Pd), 22.5 atomic percent lead, and 22.5 atomic percent antimony; 41.2 atomic percent zirconium (Zr), 13.8 atomic percent titanium (Ti), 12.5 atomic percent copper (Cu), 10 atomic percent Ni, and 22.5 atomic percent beryllium; and amorphous alloys based on Zr, Pd, Fe, Ti, Cu, or magnesium.

The predominant constituent of the creep-resistant material may be a non-magnetic metallic material. For example, the beam 104 may be formed of aluminum, platinum, silver, and/or Cu. Forming the beam 104 of a non-magnetic material may facilitate use of the switch structure 100 in environments in which the switch structure is expected to operate in the presence of strong magnetic fields, such as in magnetic resonance imaging applications.

Further in view of Applicants' discovery, the beam 104 may be configured so as to limit, under use conditions, including temperatures under 50 percent or even under 30 percent of the minimum melting temperature associated with one of the metals constituting a substantial part of the beam, permanent deformation of the beam due to time-dependent plastic deformation of the metallic material from which the beam is substantially formed. In embodiments which limit permanent deformation of the beam 104, the beam can be considered to be "formed substantially" of metallic material when the mechanical behavior of the beam is generally or significantly determined by the mechanical behavior of constituent metallic material. The beam can at times be disposed in the open position, in which the beam is separated from the contact 102 by a separation distance d. At other times, the beam 104 can be disposed in the closed position, in which the beam comes into contact the contact 102. During operation of the switch structure 100, for which permanent deformation of the beam 104 is limited, the beam 104 may be deformed into the closed position for a cumulative time of at least $10^7$ seconds while at a temperature between room temperature and about half of the melting temperature of the metallic material (or, where the metallic material includes multiple discrete metallic materials, the melting temperature of one of the metallic materials from which the beam is substantially formed). The beam 104 may be geometrically configured such that, subsequent to such deformation, the separation distance d between the beam 104 and the contact 102, in the absence of external forces, varies by less than 20 percent over the cumulative time. That is, measurements of d taken at any time over the cumulative time would yield a result that does not vary by more than 20 percent.

For example, referring to FIGS. 6A-6C, at time $t_0<0$, the beam 104 can be disposed in the first, non-contacting, position, in which the beam is separated from the contact 102 by a separation distance $d=d_0$. A force F can then be applied to the beam 104 at time $t_1=0$ in order to deform the beam into a second, contacting, position, such that the beam comes into contact with the contact 102. The beam 104 can then be maintained in the second position until a time $t_2=10^7$ seconds, at which point the force F can be removed. As the force F is removed, the beam 104 can resume a non-contacting position, being separated from the contact 102 by a separation distance $d=d_1$.

When the stresses experienced by the beam 104 are less than necessary to cause permanent plastic deformation of the metallic material from which the beam is substantially formed, i.e., when the beam is completely free from the effects of time-dependent plastic deformation, $d_0=d_1$. Under conditions which result in no permanent plastic deformation, it is expected that the magnitude of the force F required to maintain the beam 104 in the second position, and the amount of mechanical energy stored in the beam when disposed in the second position, each remain constant as a function of time. However, under conditions of modest time-dependent plastic deformation, $d_1$ is less than $d_0$ and the beam 104 can be configured so as to assure that the separation distance d between the contact 102 and the beam remains sufficient over a predetermined time period to allow the switch structure 100 to function properly.

For example, the beam 104 can be configured so as to assure that $d_1 \geq 0.8d_0$. The beam 104 can store sufficient energy during deformation to cause the beam to substantially assume the first position (e.g., within 20 percent) in the absence of external forces. The beam 104 and the anchor 107 may define an angle θ therebetween, and the beam 104 can be configured such that the angle θ, in the absence of external forces acting on the beam, varies by less than 0.5 percent, and in some cases less than 0.1 percent, as a result of the beam being deformed between the first and second positions.

Applicants have further discovered that, for switch structures including a cantilevered beam, for example, as shown in FIG. 1, time dependent plastic deformation in the anchor of the beam (or the structure from which the beam is otherwise cantilevered) can be a significant cause for a permanent change in the overall beam configuration. For embodiments in which $d_1 \geq 0.8d_0$, the beam 104 can be configured such that, when the beam is deformed into the second position, a maximum, non-localized, steady-state strain rate in the anchor remains less than about $10^{-12}$ s$^{-1}$. The beam 104 can be configured such that the total plastic strain experienced by the anchor 106 remains less than some percentage of the elastic strain induced in the anchor upon initial deformation of the beam into the contacting position (prior to any significant creep in the beam). For example, if an initial deformation of the beam 104 into the second position induces a first elastic strain in the anchor 106, and thereafter the beam is deformed into the second position for a cumulative time of at least $10^7$ seconds, the beam can be configured such that the anchor experiences a maximum, non-local total plastic strain of less than about half of the first elastic strain.

The beam 104 can be designed so as to limit the stress realized in the anchor 106 during deformation of the beam to below a threshold value, above which excessive plastic deformation would be realized. This threshold stress would depend on one or more of the temperature at which the beam 104 is deformed, the amount of shape change of the beam that can be tolerated within an application, and the material(s) from which the beam is substantially formed, including both the composition and the microstructure of the material(s).

For example, for applications in which the switch structure 100 operates at a temperature less than about half the melting temperature of the material(s) from which the beam 104 is substantially formed, Applicants have found that acceptable performance (e.g., a change in the separation distance between the beam and contact of less than 20 percent over a cumulative time of deformation of $10^7$ seconds or even up to $10^8$ seconds) can be achieved when the stress in a non-localized portion of the anchor (i.e., away from a highly localized stress concentration region) is less than 1000 MPa when the beam includes a constituent metallic material that is alloy having at least 65 atomic percent nickel and at least 1 atomic percent tungsten. As other examples, Applicants have found that acceptable performance over a one year time span can be achieved when the stress in a non-localized portion of the anchor (i.e., away from a highly localized stress concentration region) is less than 45 MPa; and acceptable performance over a twenty year time span year can be achieved when the stress in a non-localized portion of the anchor (i.e., away from a highly localized stress concentration region) is less than 20 MPa. In these examples, the constituent metallic material may include 80 atomic percent gold and 20 atomic percent nickel. Applicants have also found that, for beams formed of pure gold, acceptable performance over a time span of one year can be achieved when the stress in a non-localized portion of the anchor is less than 25 MPa.

Overall, the beam 104 can be designed so as to limit stresses and/or plastic strains in the anchor 106. For example, referring to FIGS. 7-9, a switch structure 200 can include a contact 202 and a conductive element, such as a cantilevered beam 204, formed substantially of conductive material (e.g., metal). The beam 204 can be supported by an anchor 206 and a base 207, which may be integrated with the beam and may serve to connect the beam to an underlying support structure, such as a substrate 208. The contact 202 may also be supported by the substrate 208. The switch structure 200 may also include an electrode 210 configured to actuate the beam 204.

A variety of physical and/or design parameters may affect the stresses in the anchor 206. The switch structure 200 characteristics may, for example, be characterized by any of: the beam length $L_B$, the beam width $w_B$, the beam thickness $t_B$, contact length $L_C$, contact width $w_C$, contact thickness $t_C$, beam-contact separation distance (in the absence of external forces) $d_{BC}$, beam-electrode overlap length $L_E$ (measured from the end 205 of the beam 204), electrode width $w_E$, beam-electrode separation distance (in the absence of external forces) $d_{BE}$, material properties of the beam composition, and a maximum voltage difference $V_{max}$ between the beam and the electrode 21. Based on selection of values for these parameters, in conjunction with expected operational temperatures, switch structures can be produced which have sufficiently low stresses in the area of the anchor 206 to enable operational lifetimes for the switch structure 200 greater than one year and even greater than 20 years.

In some embodiments, the thickness $t_B$ of the beam 204 can be at least 1 μm. A thickness $t_B$ of about 1 μm or more may limit subsequent deformation of the beam due to subsequent processing at elevated temperatures. The length $L_B$ of the beam 204 can be at least about 20 μm. The contact 202 can be disposed so as to oppose the beam 204 over an area defined by an overlap length $L_o$ that is within 20 percent of a free end 205 of the beam. The electrode 210 may be disposed within 50 percent of the free end 205 of the beam 204, and in some embodiments within twenty to thirty percent of the free end.

The beam 204 can have a length $L_B$ that is less than about 200 times the thickness $t_B$ and is also less than about 1000 times the separation distance $d_{BC}$ between the beam and the associated contact 202. Where the beam 204 has a larger aspect ratio or is separated from the contact 202 by a smaller distance, the stress induced in the beam when deformed into the contacting position may be relatively low. However, as the length of the beam 204 is increased, the number of beams that can be placed in a given area will decrease. Further, as the separation distance $d_{BC}$ is reduced, failure mechanisms other than creep-related deformation may become significant. For example, as the beam 204 and contact 202 approach one another, the attractive force there between increases for a given voltage difference, and this attractive force could become large enough to cause the beam to unintentionally assume the contacting position (e.g., even in the absence of a voltage at the electrode 210). Also, the area between the beam 204 and the contact 202 may be more likely to experience electrical breakdown due to, for example, field emission.

By configuring the beam 104, 204 so as to avoid significant creep during use, the separation distance $d_{BC}$ between the beam and the contact 102, 202 can be maintained fairly constant, say, within 20 percent of its initial value, for a time in use of up to 1 year and in some cases upwards of 20 years (a requirement for some applications). In other words, for each instance in which the beam 104, 204 is urged from the non-contacting position (in which the beam is separated from the contact 102, 202 by a distance $d_{BC}$) and toward the contacting position by an applied force and then the applied force is removed, the beam will substantially return to the non-contacting position such that the beam is separated from the contact by the distance $d_{BC}$, where the value of $d_{BC}$ varies by less than 20 percent.

Based on selection of values for the above-referenced design parameters of the switch structure 200, including selection of beam material and operational temperature, Applicants have found that switch structures can be produced for which stresses in the area of the anchor 206 are sufficiently low to enable operational lifetimes (e.g., a change in the separation distance between the beam 204 and contact 202 of less than 20 percent, i.e., $d_1 \geq 0.8 d_0$) for the switch structure 200 of at least one year and greater than 20 years. The table below provides several combinations of parameter values, operational temperatures, and beam materials for which Applicants have observed such acceptable performance.

| Parameter | Au beam | Ni-12 atomic % W beam |
|---|---|---|
| operational lifetime (years) | 20 | 20 |
| operational temperature (C.) | 80 | 200 |
| $L_B$ (μm) | 190 | 95 |
| $t_B$ (μm) | 7 | 3 |
| $t_C$ (μm) | 0.3 | 0.3 |
| $d_{BC}$ (μm) | 0.4 | 1 |
| $L_E/L_B$ | 0.2 | 0.2 |
| $V_{max}$ (V) | 21 | 120 |

The process temperatures associated with the production of the above-described switch structure 100 formed substantially of metallic material are moderate, usually less than 450° C. This is in contrast to the temperatures required to form a conductor from silicon which, when employing a conventional doping procedure, are usually greater than 900° C. The lower processing temperatures associated with the switch structure 100 may facilitate the integration of the switch structure with temperature-sensitive components, such as, for example, MOSFETs.

Figure 10A:
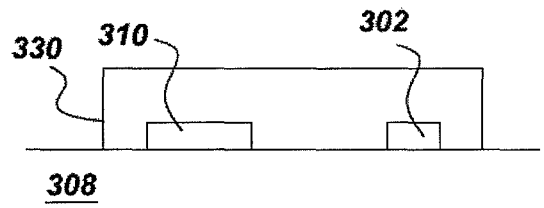
Figure 10B:
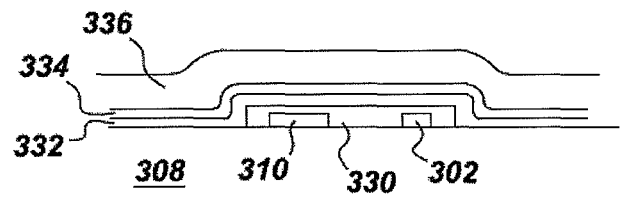

As mentioned above, switch structures such as the switch structure 100 of FIG. 1, can be fabricated on substrates using conventional microfabrication techniques. For example, referring to FIGS. 10A-10E, there is shown a schematic representation of a fabrication process for producing a switch structure configured in accordance with an example embodiment. First, a substrate 308 can be provided with an electrode 310 and a contact 302 disposed thereon. A layer of silicon dioxide 330 (also referred to herein as a removable layer) is then deposited, for example, by vapor deposition, and patterned so as to encapsulate the electrode 310 and contact 302 (FIG. 10A). A thin adhesion layer 332 (e.g., titanium), a seed layer 334 (e.g., gold), and a metal layer 336 (e.g., Ni-4 atomic percent W) can then be deposited via electroplating (FIG. 10B). A layer of photoresist 338 is then be applied and patterned using conventional photolithography (FIG. 10C), after which the metal, seed, and adhesion layers 336, 334, 332 are etched to form a beam 304 and the photoresist is subsequently removed (FIG. 10D). Finally, the layer of silicon dioxide 330 supporting the beam 304 and encapsulating the electrode 310 and contact 302 is removed (FIG. 10E). As shown in FIG. 10F, the switch structure device 300 may be enclosed and hermetically sealed with a protective cap 340, which is bonded to the substrate 308 with an intervening layer of glass frit (not shown) at, for example, a temperature in the range of about 300-450° C. for fifteen minutes. In the above-described fabrication process, other removable layers may be used in lieu of layer of silicon dioxide 330 such as, for example, a layer of electrodeposited copper.

Referring next to FIGS. 11-13, there is shown in several views a switch structure 400 configured in accordance with another example embodiment. The switch structure can include a contact 402 and a conductive element, such as a cantilevered beam 404, formed substantially of conductive material (e.g., a metal). The beam 404 can be supported by an anchor 406 and a base 407, which may be integrated with the beam and may serve to connect the beam to an underlying support structure, such as a substrate 408. The switch structure 400 may also include an electrode 410 configured to actuate the beam 404. The beam 404 may include a first beam portion 404a having a width $w_{B1}$ and a second beam portion 404b having a width $w_{B2} > w_{B1}$. The electrode 410 can have a width $w_E$, which width may be roughly equal to $w_{B2}$. In this way, the actuating force provided by the electrode 410 can be modulated by modulating the corresponding widths of the second beam portion 404b and the electrode. The second beam portion 404b may also have a length $L_{B2}$ that is roughly equal to the length $L_E$ of the electrode 410.

FIGS. 14 and 15 illustrate views of a switch structure 500 configured in accordance with another example embodiment. The switch structure can include a contact 502 and a cantilevered beam 504 supported by an anchor 506 and a base 507. The switch structure 500 may also include an electrode 510 configured to actuate the beam 504. The beam 504 can have a width $w_B$, and the electrode 510 can have a width $w_E$ that may be different from the width of the beam. Where $w_E > w_B$ the electrostatic force produced by the electrode 510 and acting on the beam 504 may cause efficient actuation of the beam, possibly lowering the energy required to actuate the beam. The contact 502 may include several discrete contact structures 502a, 502b, and the beam 504 may provide electrical current to each contact structure in parallel or from one to the other in series.

Referring to FIG. 17, in some embodiments, a switch structure 600 may include a conductive element 604 that has multiple first cantilever portions 604a, 604b connected to a common second beam portion 604c. Referring to FIG. 18, a switch structure 700 may include an opposing contact 702 and beam 704. The beam 704 may include a protrusion 709 configured to make contact with the contact 702 as the beam is actuated. Such configurations of the beam 704 may facilitate a contact 702 that has a thickness $t_C$ about equal to the thickness $t_E$ of an associated electrode 710.

Embodiments may be practiced with electrodeposition of alloys such as Ni—W. Under a wide range of conditions, electroplated Ni—W and other binary electroplated alloys can be nanocrystalline material with an average grain size on the order of about 10 nm. This is three orders of magnitude smaller than traditional engineering materials, which typically have grain sizes in the range of 10-100 μm (10000-100000 nm). The nanocrystalline grain size is a characteristic of the electroplating process, which operates far from equilibrium. Such an exemplary Nickel-tungsten alloy plating process is available from Enthone Inc. of West Haven, Conn. to form an alloy sold under the name ENLOY® Ni-500. ENLOY® is a registered trademark of Enthone Inc. The plating process may operate at 60° C., at a current density of 60 mA/cm² and at a pH of 7.5. That is, the speed at which atoms deposit over one another in an electroplating process can be faster than that at which atoms can arrange themselves into a lower energy state characterized by a relatively large grain size. Commonly, electroplated materials also contain a relatively high density of point defects, such as vacancies (voids) and interstitial impurities (e.g., hydrogen, which is a byproduct of the reduction reaction during plating from an aqueous solution) and line defects such as dislocations. Because of the small grain size and the high defect density, electroplated materials in general, and Ni—W specifically, can have very different mechanical properties than alloys produced by other processes.

When the material of the beam is heat treated at temperatures below 500° C. (or about ⅓ of the melting point), limited grain growth is observed, and limited changes in the microstructure are expected. However, as demonstrated in FIGS. 20A and 20B, such anneals can significantly enhance the creep resistance of the material. Without being bound to any particular theory, it may be that as diffusion rates increase upon heating, defect densities can be reduced, leading to improved creep resistance. That is, even a relatively low temperature heat treatment enables movement of impurities, filling of vacancies, annihilation of dislocations and the alignment of grain boundaries; and with such removal of excess defects, the material reaches a lower energy state. With the afore-described electroplating process, the as-deposited metal, e.g., an alloy such as Ni—W, has a combination of small nanocrystalline grain size and a relatively large number of quenched-in defects which result in a relatively high energy state. This high defect density causes more rapid deformation (e.g., via diffusion, grain boundary sliding, or other mechanisms) than in a relaxed structure. Structural relaxation of this metal can be effected with an anneal at a relatively low temperature for a relatively short time period, reducing the defect concentration and, consequently, improving creep resistance. For example, a measurable decrease in H and O content in Ni—W is observed after heating the as-deposited material at 450° C. for only 15 min. Specifically, the H content was observed to decrease by nearly a factor of ten and the 0 content was seen to decrease by a somewhat lesser, but nonetheless significant degree. In addition, it has also been observed that relaxation of the atomic structure occurs on annealing, imparting greater registry along the grain boundaries. FIGS. 19A and 19B are filtered Transmission Electron Microscope (TEM) images which illustrate such differences in crystalline order.

FIG. 19A illustrates a grain boundary showing atomic planes of differing orientation meeting to form a grain boundary, and FIG. 19B illustrates a grain boundary after a relatively low temperature heat treatment;

The grain boundary of FIG. 19A, the as-deposited (not annealed) sample of electrodeposited Ni—W, has a relatively irregular interface between grains and contains a relatively large number of defects. Approximately twenty-eight dislocations (defects) are evidenced. FIG. 19B illustrates enhanced registry along an interface between similar grains after heat treatment (an anneal) of a similar sample of electrodeposited Ni—W. The anneal provides better registry along the grain boundaries. With the enhanced registry there are fewer defects. Approximately eleven dislocations are observed in FIG. 19B.

Without being bound to any particular theory, structural relaxation resulting from the anneal appears to have a significant impact on mechanical properties for MEMS applications, resulting in a substantially improved life of the device. In many MEMS applications it is considered essential, when a component is subjected to repeated or continual mechanical stress, that the component under load not experience permanent deformation. To evaluate the performance of an example electroplated Ni—W material suitable for use in the beam 104, a stress relaxation comparison was made between as-deposited and annealed samples of Ni—W material. The susceptibility to plastic deformation was quantified with stress relaxation tests wherein an initial strain was applied to test specimens. The resulting load drop of each specimen was then recorded over a period of time. To the extent that a sample specimen relaxed, the load required to sustain a given displacement of the beam decreased. The material having better creep resistance exhibits less relaxation and a smaller load drop over time. The results of two sets of evaluations performed at test temperatures of 300° C. and 400° C. are illustrated in FIG. 20.

As can be seen from the results shown in FIG. 20A, for a test conducted at 300° C., a "heat treated" Ni—W exhibited less stress relaxation than an "as deposited" Ni—W (i.e., the same material without heat treatment). In fact, the "heat treated" material exhibited essentially no change in load characteristics during a time period extending to nearly $10^6$ sec. while the "as-deposited" material experienced a significant load drop, on the order of about forty percent, during the same time period. The results shown in FIG. 20B, for a test conducted at 400° C., again indicate that even at a higher temperature "heat treated" Ni—W exhibits less stress relaxation than an "as deposited" Ni—W. The "as-deposited" layer had a change in load of about eighty percent while the "heat treated" materials only relaxed by about twenty five percent.

While the theory supporting this effect is not fully established, it is believed that an anneal of the as-deposited alloy results in substantial annihilation of defects and this annihilation leads to improved stress relaxation performance. It is believed that greater defect densities present in the as-deposited material, i.e., without an anneal, facilitate a higher rate of plastic deformation. When the defect density is reduced via an anneal, the modified material can sustain a higher load for a longer period of time before incurring the same amount of permanent strain. This improvement translates directly into improved life for MEMS and NEMS devices. Based in part on observations of defects shown in FIG. 19, it is believed that an anneal according to embodiments presented herein can reduce the defect density in a deposited metallic layer by at least fifty percent and, when performed at appropriate temperatures for sufficient durations, the defect density can be reduced by sixty or seventy percent or even more to the limit where only geometrically necessary defects are present.

As mentioned above, switch structures such as the switch structure 100 of FIG. 1, can be fabricated on substrates using conventional micro-fabrication techniques. With reference again to FIGS. 10A-10F, there is now described another fabrication sequence for constructing such a switch structure device with an anneal step according to an example embodiment having a cantilevered beam comprising a Ni—W alloy. The process begins with a conventional silicon substrate 308 on which an electrode 310 and a contact 302 are formed thereon. A layer of silicon dioxide 330 is then deposited, e.g., by chemical vapor deposition, to encapsulate the electrode 310 and the contact 302. The layer of silicon dioxide 330 is then patterned as shown in FIG. 10A. A thin adhesion layer 332 (e.g., titanium), is deposited over the layer of silicon dioxide 330. Next, a seed layer 334 is deposited over the adhesion layer 332. For the illustrated embodiment having a Ni—W beam, the seed layer may be sputtered Au. Next, a conductive layer, such as metal layer 336, is deposited via electroplating. See FIG. 10B which illustrates the afore described series of layers. More generally, the metal layer 336 may be a pure metal or an alloy chosen from a wide variety of metals. In the present example, the metal layer 336 may comprise Ni alloyed with twenty atomic percent W, but the composition could range from less than one atomic percent to over fifty atomic percent W.

Figure 10C:
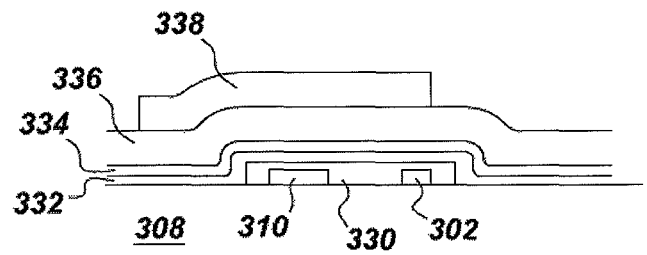
Figure 10D:
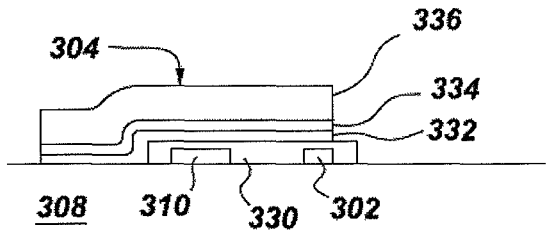
Figure 10E:
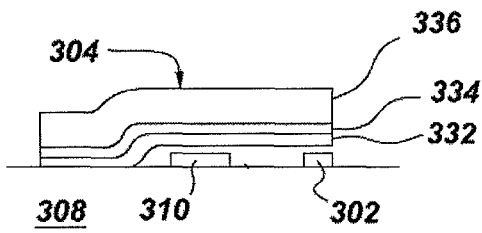
Figure 10F:
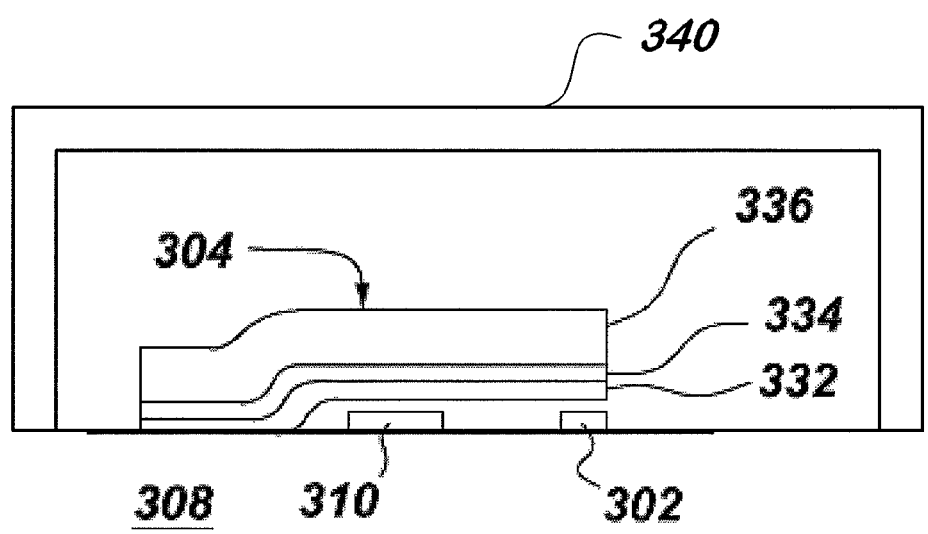

Referring next to FIG. 10C, a layer 338 of photoresist is applied and patterned using conventional photolithography, and the metal, seed, and adhesion layers 336, 334, 332 are etched to form a beam 304. The pre-release structure is shown after removal of the photoresist in FIG. 10D. According to one embodiment, an anneal is performed on this prerelease structure at approximately 500° C. for 24 hours. More generally, the anneal may be performed in the range of about 300° C.-600° C. or in the range of ten to fifty percent of the melting temperature of the conductive layer, but lower or higher anneal temperatures may be satisfactory. The anneal time can range from less than one hour to over 48 hours. After the anneal is performed, the layer of silicon dioxide 330, which supports the beam 304 over the substrate 308, is removed with an isotropic etchant, resulting in the beam 304 being cantilevered, such that the electrode 310 and the contact 302 are no longer encapsulated. Consequently, the electrode 310 can provide a Coulomb charge to displace the beam and cause electrical contact between the contact 302 and the beam 304. As shown in FIG. 10F, the switch structure device 300 may be enclosed and hermetically sealed with a protective cap 340, which is bonded to the substrate with an intervening layer of glass frit (not shown) at, for example, a temperature in the range of about 300-450° C. for fifteen minutes. Electrical connections (not shown) may be routed under or through the cap 340.

In the above-described example, the anneal is performed on the pre-release structure, i.e., prior to removal of the encapsulating layer of silicon dioxide 330. In other embodiments, the anneal can be performed after removal of the layer of silicon dioxide 330, e.g., in conjunction with the bonding of the protective cap 340. If done at the same time that the cap 340 is bonded in place, the temperature can be in the range of about 300° C.-600° C. for up to forty-eight hours.

While certain features of the invention have been illustrated and described with reference to exemplary embodiments, numerous modifications and changes will be apparent to those skilled in the art. For example, with respect to the example embodiments, while the conductive element of the switch structure 100 of FIG. 1 has been exemplified by a cantilevered beam, other deformable contact structures are also contemplated including, for example, fixed-fixed beams, torsional elements, and diaphragms. Further, while the disclosed embodiments describe a beam having a monolithic metallic layer configured to inhibit time-dependent deformation, other embodiments include beams comprising multiple layers of metallic material, some or all of which may be configured to inhibit time-dependent plastic deformation. Further, although Ni—W alloys have been described in relation to the beam 104, beams and other structures may be fabricated from numerous other metals and alloys including, for example, Ni—Co, Ni—Mn, Au—W. The relative proportion of metals in the various alloys may vary considerably. For example, a Ni—W alloy used for the beam 104 may contain less than one percent to more than fifty percent atomic W, although an alloy comprising about twenty to thirty percent atomic W may exhibit greater creep resistance. Also, the disclosed anneal times and anneal temperatures may vary considerably from the exemplary values. For example, the anneal time may range from less than one hour to more than a few days, and the anneal temperature is not limited by the exemplary ranges described herein. Numerous electroplating processes are suitable for practicing the invention.

More generally, embodiments and concepts described herein may be applicable to a wide range of Micro-electromechanical systems (MEMS) and Nano-electromechanical systems (NEMS). It is noted that in situ formation of MEMS components comprising silicon (e.g., fixed-fixed beams, rotatable gears, torsional elements, or diaphragms) has involved deposition of the component layers on rigid layers such as a silicon substrate. These same structures can be manufactured with metallic layers deposited according to the present teachings on flexible substrates or on rigid substrates (e.g., such as single crystal silicon, polysilicon, semiconductor material of other compositions, silicon dioxide, or even ceramic layers). These and other structures can also be manufactured by depositing metallic layers over flexible substrates according to the present teachings. Also, free standing beams, fixed-fixed beams, gears, torsional elements and diaphragms can be fabricated with any of a variety of deposition processes (e.g., physical vapor deposition, chemical vapor deposition, sputtering, electroless deposition, or electrodeposition) These and still other structures may be fabricated for electrical applications, electro-mechanical applications and purely mechanical applications.

It is to be understood that the scope of the invention is only limited by the claims which follow and the claims are The claimed invention is:

1. A method of forming a micro-electromechanical system (MEMS) device, comprising:
   (A) forming a removable layer atop a substrate, the substrate having an anchor extending therefrom, wherein the anchor is configured to support a structure;
   (B) depositing a metallic alloy layer atop the removable layer, wherein the metallic alloy layer comprises about 50 to about 99 percent of a constituent metallic material;
   (C) removing the removable layer to form the structure comprising the metallic alloy layer, wherein the structure is configured to be deformable between a first position in which the structure is separated from a contact disposed atop the substrate by a separation distance and a second position in which the structure contacts the contact and stores mechanical energy;
   (D) annealing the metallic alloy layer at a first temperature to provide the structure having a steady-state plastic strain rate of less than or equal to about $10^{-12}$ $s^{-1}$ when subject to a stress of up to about 25 percent of the yield strength of the metallic alloy layer at temperatures less than or equal to about half of a melting temperature of the metallic alloy layer, wherein the first temperature is about 40 degrees Celsius to about 50% of a melting temperature of one or more materials from which the metallic alloy layer is formed; and
   E) subsequent to annealing the structure, heating a hermetic sealing cap to a second temperature to bond the hermetic sealing cap over the metallic alloy layer, wherein the second temperature is less than the first temperature and wherein D) is performed between B) and C) or between C) and E).

2. The method of claim 1 wherein ter patterning and etching, the structure is in the form of a cantilevered beam over which the hermetic sealing cap may be formed to hermetically seal the structure.

3. The method of claim 1 further including:
   forming both the contact and an electrode on the substrate and encapsulating both the contact and the electrode with the removable layer prior to depositing the metallic alloy layer, so that after removal of the removable layer, with application of a force to the metallic alloy layer, a portion of the metallic alloy layer can be displaced to make physical contact with the contact.

4. The method of claim 1 wherein depositing the metallic alloy layer includes:
   forming an adhesion layer over the substrate, and
   depositing a seed layer over the adhesion layer.

5. The method of claim 1 wherein the metallic alloy layer is deposited with an electroplating process.

6. The method of claim 1 wherein the metallic alloy layer comprises an alloy of at least two of (nickel) Ni, tungsten (W) aluminum (Al), titanium (Ti), chromium (Cr), manganese (Mn), iron (Fe), cobalt (Co), copper (Cu), zinc (Zn), niobium (Nb), molybdenum (Mo), silver (Ag), tantalum (Ta), palladium (Pd) or zirconium (Zr).

7. The method of claim 6, wherein the metallic alloy layer comprises Ni alloyed with W having between one and fifty percent W.

8. The method of claim 1 further including bonding a cap over the structure and improvement in time-dependent plastic deformation characteristics of the beam is had at least in part by heating of the structure prior to bonding of the cap.

9. The method of claim 1 wherein the heating is performed in the range of ten to fifty percent of the melting temperature of the metallic layer and improves time-dependent plastic deformation characteristics of the structure.

10. The method of claim 9 wherein the heating of the structure is performed for a time duration in the range of one to 48 hours.

11. A structure of a micro-electromechanical system (MEMS) device made in accord with a method, comprising:
   (A) forming a removable layer atop a substrate, the substrate having an anchor extending therefrom, wherein the anchor is configured to support a structure;
   (B) depositing a metallic alloy layer atop the removable layer, wherein the metallic alloy layer comprises about 50 to about 99 percent of a constituent metallic material;
   (C) removing the removable layer to form the structure comprising the metallic alloy layer, wherein the structure is configured to be deformable between a first position in which the structure is separated from a contact disposed atop the substrate by a separation distance and a second position in which the structure contacts the contact and stores mechanical energy;
   (D) annealing the metallic alloy layer at a first temperature to provide the structure having a steady-state plastic strain rate of less than or equal to about $10^{-12}$ $s^{-1}$ when subject to a stress of up to about 25 percent of the yield strength of the metallic alloy layer at temperatures less than or equal to about half of a melting temperature of the metallic alloy layer, wherein the first temperature is about 40 degrees Celsius to about 50% of a melting temperature of one or more materials from which the metallic alloy layer is formed; and
   E) subsequent to annealing the structure, heating a hermetic sealing cap to a second temperature to bond the hermetic sealing cap over the metallic alloy layer, wherein the second temperature is less than the first temperature and wherein D) is performed between B) and C) or between C) and E).

12. The method of claim 1, wherein the metallic alloy layer is deposited via a physical vapor deposition (PVD) process.

13. The method of claim 1, wherein the structure is configured such that, subsequent to being deformed into the second position at a temperature between about room temperature and about half of a melting temperature of said metallic material for a cumulative time of at least $10^7$ seconds, the separation distance in the absence of external forces varies by less than 20 percent over the cumulative time.

14. The method of claim 1, wherein the micro-electromechanical system device is one of a switch or resonator.

15. The method of claim 1, wherein the metallic alloy layer is annealed for a time of greater than 15 minutes.

16. The method of claim 1, wherein the substrate comprises a semiconductor device formed thereon.

17. The method of claim 1, wherein the anchor and the structure form a single-piece structure arranged both as an electrically conductive element and a structural element, wherein a singular time-dependent plastic deformation of the single-piece structure is substantially determined by the time-dependent plastic deformation of the constituent metallic material of the single-piece structure.

* * * * *

UNITED STATES PATENT AND TRADEMARK OFFICE
CERTIFICATE OF CORRECTION

PATENT NO. : 8,826,529 B2  Page 1 of 1
APPLICATION NO. : 12/975090
DATED : September 9, 2014
INVENTOR(S) : Detor et al.

It is certified that error appears in the above-identified patent and that said Letters Patent is hereby corrected as shown below:

In the Specification

In Column 9, Line 56, delete "anchor 107" and insert -- anchor 106 --, therefor.

In Column 14, Line 25, delete "treatment;" and insert -- treatment. --, therefor.

In the Claims

In Column 17, Lines 35-36, in Claim 2, delete "wherein ter patterning and etching, the" and insert -- wherein the --, therefor.

In Column 17, Line 54, in Claim 6, delete "tungsten (W)" and insert -- tungsten (W), --, therefor.

In Column 18, Line 11, in Claim 11, delete "in accord" and insert -- in accordance --, therefor.

Signed and Sealed this
Second Day of June, 2015

Michelle K. Lee
*Director of the United States Patent and Trademark Office*